(12) United States Patent
Kim

(10) Patent No.: US 12,726,692 B2
(45) Date of Patent: Sep. 1, 2026

(54) IMAGE SENSOR MODULE, MANUFACTURING METHOD THEREOF AND CAMERA MODULE INCLUDING THE SAME

(71) Applicant: SAMSUNG ELECTRO-MECHANICS CO., LTD., Suwon-si (KR)

(72) Inventor: Jang Hun Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 211 days.

(21) Appl. No.: 18/428,659

(22) Filed: Jan. 31, 2024

(65) Prior Publication Data

US 2024/0357220 A1 Oct. 24, 2024

(30) Foreign Application Priority Data

Apr. 21, 2023 (KR) ........................ 10-2023-0052892
Sep. 4, 2023 (KR) ........................ 10-2023-0116970

(51) Int. Cl.
*H04N 23/54* (2023.01)
*H04N 23/51* (2023.01)
*H10F 39/00* (2025.01)

(52) U.S. Cl.
CPC ............. *H04N 23/54* (2023.01); *H04N 23/51* (2023.01); *H10F 39/804* (2025.01)

(58) Field of Classification Search
CPC ...... H10F 39/804; H04N 23/51; H04N 23/54; H04N 23/55; H04N 23/57
See application file for complete search history.

(56) References Cited

U.S. PATENT DOCUMENTS

2004/0077121 A1* 4/2004 Maeda .................. H10F 39/811
257/E27.15
2006/0227236 A1* 10/2006 Pak ........................ H04N 23/54
257/E31.127
2019/0320096 A1* 10/2019 Chen ...................... H04N 23/54
(Continued)

FOREIGN PATENT DOCUMENTS

CN 101056355 A 10/2007
JP 5152695 B2 2/2013
(Continued)

OTHER PUBLICATIONS

Korean Office Action issued on Jan. 14, 2025, in corresponding Korean Patent Application No. 10-2023-0116970. (9pages in English, 6pages in Korean).

*Primary Examiner* — Amy R Hsu
(74) *Attorney, Agent, or Firm* — NSIP Law

(57) ABSTRACT

An image sensor module is provided. The image sensor module includes an image sensor which has an imaging plane; a substrate on which the image sensor is mounted; and a sub-housing, coupled to the substrate, and configured to accommodate the image sensor, wherein, in the sub-housing and the substrate, first and second end portions of the sub-housing and the substrate that are spaced apart in a first direction, parallel to the imaging plane, are disposed together on one plane, perpendicular to the first direction, and the sub-housing includes a first stepped portion that is grooved in a direction, away from the image sensor, on an internal side surface of the sub-housing that faces the image sensor in the first direction.

19 Claims, 7 Drawing Sheets

(56) References Cited

U.S. PATENT DOCUMENTS

| | | | | |
|---|---|---|---|---|
| 2020/0096722 | A1* | 3/2020 | Chang | H04N 23/55 |
| 2020/0120248 | A1* | 4/2020 | Hsu | H04N 23/55 |
| 2021/0377448 | A1* | 12/2021 | Seo | H04N 23/686 |

FOREIGN PATENT DOCUMENTS

| | | | |
|---|---|---|---|
| JP | 2021-073520 | A | 5/2021 |
| KR | 10-2006-0107257 | A | 10/2006 |
| KR | 10-2021-0147215 | A | 12/2021 |

* cited by examiner

IMAGE SENSOR MODULE, MANUFACTURING METHOD THEREOF AND CAMERA MODULE INCLUDING THE SAME

CROSS-REFERENCE TO RELATED APPLICATIONS

This application claims the benefit under 35 USC § 119 (a) of Korean Patent Application No. 10-2023-0052892 filed on Apr. 21, 2023, and Korean Patent Application No. 10-2023-0116970 filed on Sep. 4, 2023, in the Korean Intellectual Property Office, the entire disclosures of which are incorporated herein by reference for all purposes.

BACKGROUND

1. Field

The following description relates to an image sensor module and a camera module including the same.

2. Description of Related Art

Mobile camera modules are typically manufactured to have a zoom operation.

There are problems that, in order to increase a zoom magnification, a distance that light incident on a camera travels to an image sensor, that is, a total length or a total track length (TTL), should increase, and in order to realize a relatively long total track length, a thickness of camera module of the camera may increase. Accordingly, a reflector such as a prism may be used to change a path of the incident light by approximately 90 degrees to realize the relatively long total track length without increasing the thickness of the camera module.

Since the thickness of the camera module using the reflector may be determined by a size of the image sensor, a height of an image sensor module should be reduced in order to make the camera module thinner. However, since the size of the image sensor used in the camera module is determined in advance, it may be difficult to reduce the height of the image sensor module, considering various circumstances.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an image sensor module includes an image sensor including an imaging plane; a substrate on which the image sensor is mounted; and a sub-housing, coupled to the substrate, and configured to accommodate the image sensor, wherein, first end portions of the sub-housing and the substrate and second end portions of the sub-housing and the substrate, are spaced apart in a first direction parallel to the imaging plane, and are disposed together on one plane, perpendicular to the first direction, and wherein the sub-housing comprises a first stepped portion that is grooved in a direction, away from the image sensor, on an internal side surface of the sub-housing that faces the image sensor in the first direction.

The sub-housing and the substrate may include a pair of long side portions and a pair of short side portions, and the first direction may be a direction in which the pair of long side portions face each other.

The sub-housing may further include a second stepped portion that protrudes in an outward direction on the first end portion of the sub-housing and the second end portion of the sub-housing that are spaced apart in the first direction, and the first end portions of the sub-housing and the substrate and the second end portions of the sub-housing and the substrate that may be spaced apart in the first direction are disposed on the one plane, perpendicular to the first direction, together with the second stepped portion.

The sub-housing may be coupled to the substrate by an adhesive, and both end portions of the adhesive, spaced apart in the first direction, are disposed on one plane, intersecting and perpendicular to the first direction, together with the sub-housing and the substrate.

The substrate may include a central portion on which the image sensor is mounted; and a peripheral portion provided to surround the central portion and to which the sub-housing is coupled, wherein the central portion is configured to protrude more than the peripheral portion.

The pair of short side portions may face each other in a second direction, wherein the substrate comprises a portion that is exposed more than an external side surface of the sub-housing in the second direction.

Both end portions of the adhesive, spaced apart from each other in the second direction, may be disposed on the portion of the substrate that is exposed more than the external side surface of the sub-housing.

In a general aspect, an image sensor module includes an image sensor which has an imaging plane; a substrate on which the image sensor is mounted; and a sub-housing, coupled to the substrate, and configured to accommodate the image sensor, wherein a width of the sub-housing is equal to a width of the substrate in a first direction, parallel to the imaging plane, and wherein the sub-housing includes a first stepped portion that is grooved in a direction, away from the image sensor, on an internal side surface facing the image sensor in the first direction.

The sub-housing may further include a second stepped portion that protrudes in an outward direction on a first end portion of the sub-housing and a second end portion of the sub-housing that are spaced apart in the first direction, wherein the width of the substrate is equal to a width of the sub-housing including the second stepped portion in the first direction.

A camera module includes a folded module comprising a reflective member; a lens module comprising a plurality of lenses; a housing which accommodates at least the lens module among the folded module and the lens module; and the image sensor module coupled to one side of the housing and configured to receive light passing through the lens module.

The sub-housing may further include a second stepped portion that protrudes in an outward direction on a first end portion of the sub-housing and a second end portion of the sub-housing that are spaced apart in the first direction.

The sub-housing may be coupled to the substrate by an adhesive, wherein both end portions of the adhesive, spaced apart in the first direction, may be disposed on one plane, perpendicular to the first direction, together with the sub-housing and the substrate.

The sub-housing and the substrate may include a pair of long side portions that face each other in the first direction and a pair of short side portions that face each other in the second direction, and wherein the first direction may correspond to a height direction of the image sensor module.

In a general aspect, a method of manufacturing an image sensor module includes preparing a substrate including a dummy portion disposed on a first side of the substrate and a second side of the substrate spaced apart in a first direction; assembling an image sensor onto the substrate; assembling a sub-housing comprising a rib surface on the first side of the substrate and the second side of the substrate that are spaced apart in the first direction, onto the substrate on which the image sensor is assembled; and performing a trimming operation of cutting at least a portion of the rib surface and at least a portion of the dummy portion, wherein the sub-housing includes a first stepped portion that is grooved in a direction, away from the image sensor, on an internal side surface of the sub-housing that faces the image sensor in the first direction.

The sub-housing may be assembled onto the substrate through an adhesive, wherein, in the trimming operation, a portion of the adhesive disposed on an external side the rib surface and between the rib surface and the dummy portion is removed.

The sub-housing and the substrate may include a pair of long side portions that face each other in the first direction and a pair of short side portions that face each other in a second direction, and wherein the trimming operation is performed in a third direction, perpendicular to the first direction and the second direction.

The trimming operation may be implemented by a laser.

The image sensor may be assembled onto a central portion of the substrate, and the sub-housing is assembled onto a peripheral portion of the substrate that is disposed to surround the central portion of the substrate, and the dummy portion may form a portion of the peripheral portion of the substrate.

Other features and aspects will be apparent from the following detailed description, the drawings, and the claims.

Figure 1:
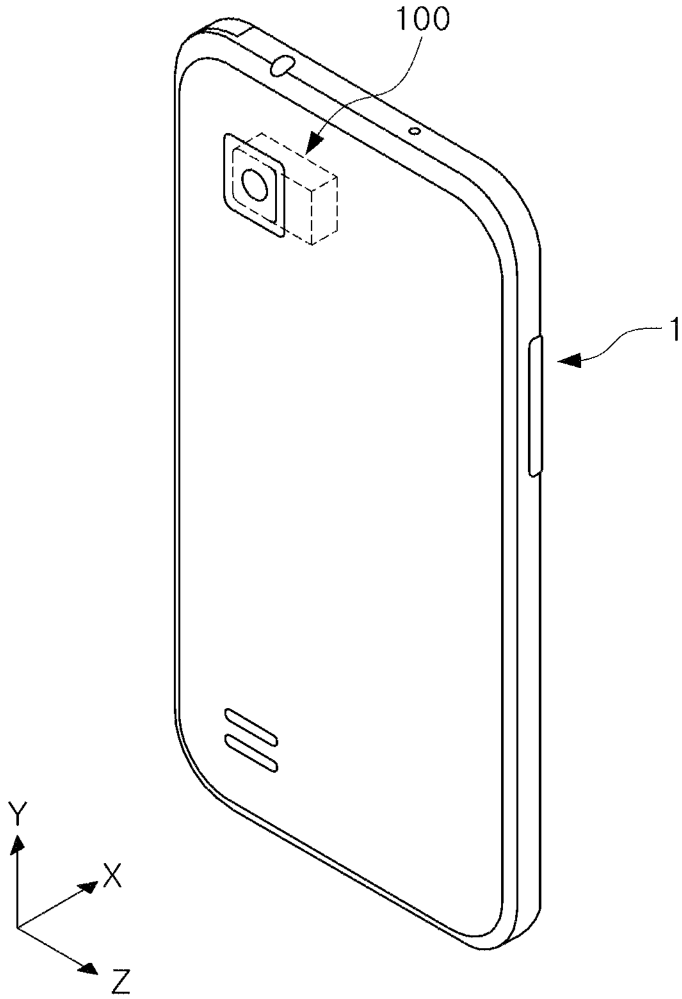
FIG. 1 illustrates a perspective view of an example portable electronic device equipped with an example camera module, in accordance with one or more embodiments.

Throughout the drawings and the detailed description, unless otherwise described, the same reference numerals refer to the same elements. The drawings may not be to scale, and the relative size, proportions, and depiction of elements in the drawings may be exaggerated for clarity, illustration, and convenience.

DETAILED DESCRIPTION

Hereinafter, while examples of the present disclosure will be described in detail with reference to the accompanying drawings, it is noted that examples are not limited to the same.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Herein, it is noted that use of the term "may" with respect to an example, for example, as to what an example may include or implement, means that at least one example exists in which such a feature is included or implemented while all examples are not limited thereto.

The features of the examples described herein may be combined in various ways as will be apparent after an understanding of this disclosure. Further, although the examples described herein have a variety of configurations, other configurations are possible as will be apparent after an understanding of this disclosure.

One or more examples may provide an image sensor module of which a size is reduced in a direction that determines a thickness of a camera module, and a manufacturing method that reduces a size of the image sensor module.

One or more examples may also provide a camera module having a relatively reduced thickness based on the image sensor module of which a size is reduced.

Figure 2:
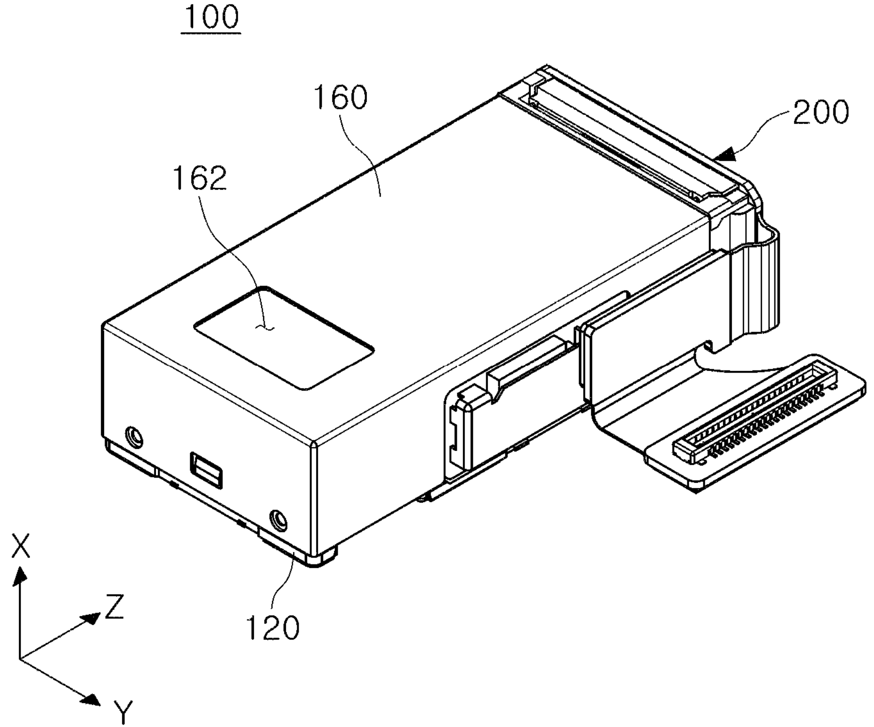
FIG. 2 illustrates a perspective view of an example camera module, in accordance with one or more embodiments.
Figure 3:
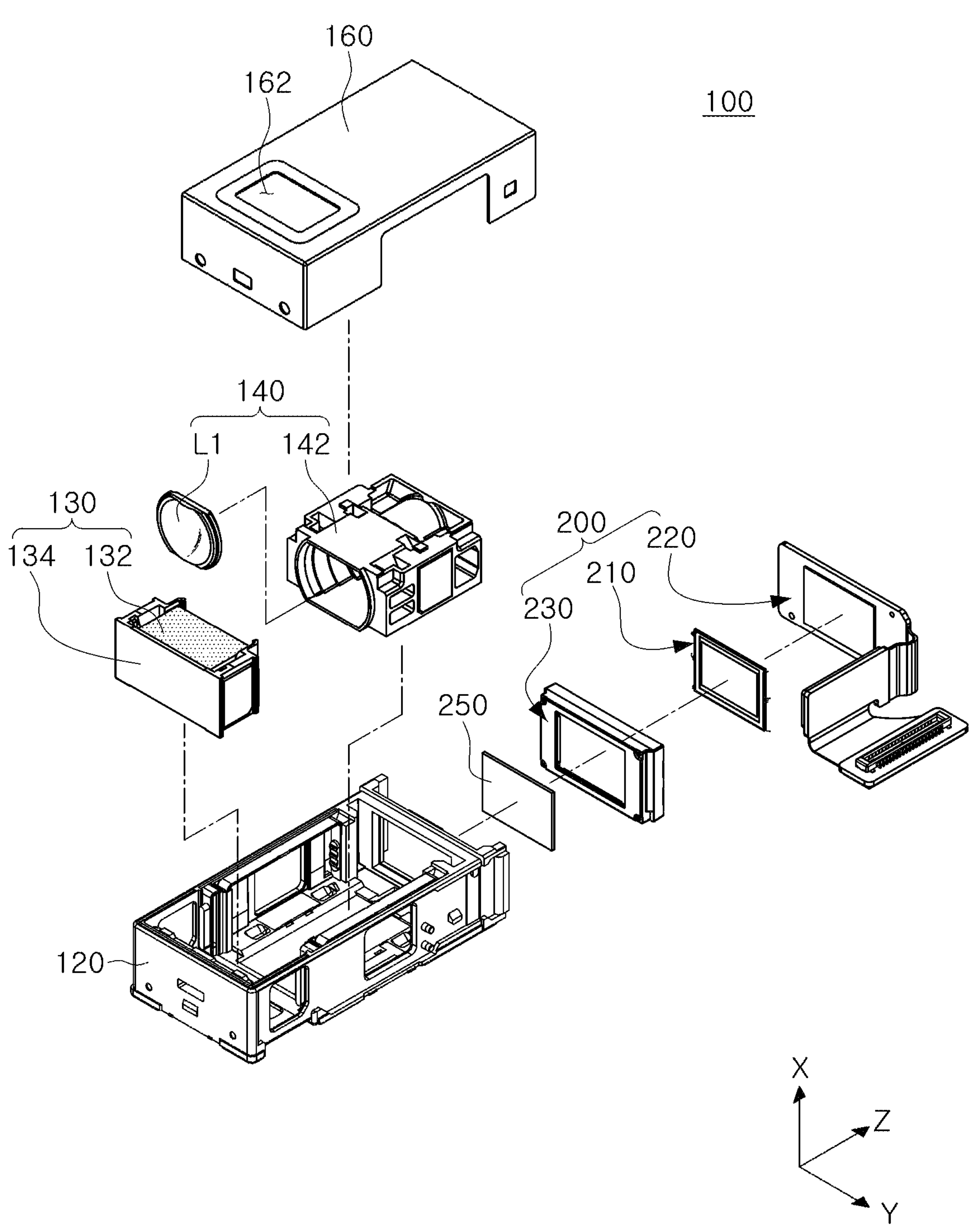
FIG. 3 illustrates a schematic exploded perspective view of the example camera module of FIG. 2.

FIG. 1 illustrates a perspective view of an example portable electronic device equipped with an example camera module, in accordance with one or more embodiments, FIG. 2 illustrates a perspective view of an example camera module, in accordance with one or more embodiments, and FIG. 3 illustrates a schematic exploded perspective view of the camera module of FIG. 2.

A camera module 100, in accordance with one or more embodiments, may be mounted on a portable electronic device 1.

Referring to FIG. 1, a portable electronic device 1 equipped or implemented with a camera module 100, in accordance with one or more embodiments, may be, as only an example, a smartphone. In another embodiment, the portable electronic device 1 may be a type of portable electronic device, such as, but not limited to, a mobile communication terminal, a tablet personal computer (PC), or the like.

The camera module 100 mounted on the portable electronic device 1 may photograph, or capture, an image of a subject outside the portable electronic device 1.

Referring to FIG. 3, the camera module 100 may include a lens module 140 and an image sensor module 200, and may have an autofocusing (AF) operation and an optical image stabilization (OIS) operation. The autofocusing (AF) and optical image stabilization (OIS) operations may be implemented by a driver provided in the camera module 100. The driver may be provided in components of the camera module 100 described below, and detailed description will be omitted.

Furthermore, the camera module 100 may be equipped with a zoom operation, and may further include a folded module (or reflection module) 130 to increase a total track length. The folded module 130 may be disposed in front of the lens module 140. Therefore, light reflected from the subject may be incident on the lens module 140 through the folded module 130.

Hereinafter, with reference to FIGS. 2 and 3, components of a camera module 100, in accordance with one or more embodiments, will be described in detail.

A camera module 100, in accordance with one or more embodiments, may include a folded module 130 that changes a propagation path of incident light, a lens module 140 including a plurality of lenses, and an image sensor module 200.

The folded module 130, the lens module 140, and the image sensor module 200 may be sequentially arranged in a propagation direction of the changed incident light in the folded module 130. The propagation direction of the changed incident light in the folded module 130 may be in parallel to an arrangement direction of the plurality of lenses, e.g., an optical axis direction (Z-axis direction). Therefore, in an example, the folded module 130, the lens module 140, and the image sensor module 200 may be arranged in the optical axis direction (Z-axis direction).

The folded module 130, the lens module 140, and the image sensor module 200 may be arranged in a housing 120. The housing 120 may have a rectangular (or box) shape which has an upper surface exposed in an upward direction. In an embodiment, the folded module 130 and the lens module 140 may be accommodated in the housing 120, and the image sensor module 200 may be coupled to one side of the housing 120 in an external space of the housing 120. The one side of the housing 120 to which the image sensor module 200 is coupled may include a portion that is exposed or opened to allow light to be incident on the image sensor module 200. In another embodiment, the lens module 140 may be accommodated in the housing 120, and the folded module 130 and the image sensor module 200 may be respectively coupled to a first side and a second side of the housing 120, in the external space of the housing 120. In this example, a portion from which both a first side and a second side of the housing 120 are exposed may be included.

A case 160 may be coupled to an exposed upper portion of the housing 120. The case 160 may protect components accommodated in the housing 120 from an external environment. According to an embodiment, when the folded module 130 and the lens module 140 are accommodated together in the housing 120, the case 160 may be provided to entirely cover the housing 120. Additionally, according to another embodiment, when the lens module 140 is accommodated in the housing 120 and the folded module 130 is coupled to the housing 120 in the external space of the housing 120, the case 160 may be provided with a portion that covers the folded module 130 and a portion that covers the lens module 140, respectively.

The case 160 may include an opening 162 through which light is incident. Referring to FIG. 1, a camera module 100, in accordance with one or more embodiments, may be mounted on the portable electronic device 1 in a state in which the opening 162 faces a rear surface of the portable electronic device 1 to allow light incident into the opening 162. The opening 162 may overlap the folded module 130 in a first axis direction (X-axis direction), perpendicular to an optical axis (Z-axis), and the first axis direction (X-axis direction) may correspond to a thickness direction of the portable electronic device 1 (direction from a front surface to a rear surface of the portable electronic device 1 or an opposite direction thereto). Therefore, light may be incident on the camera module 100 in the first axis direction (X-axis direction), may pass through the opening 162, and may be incident on the folded module 130.

The folded module 130 may include a reflective member 132 that changes a propagation path of incident light, and a holder 134 on which the reflective member 132 is mounted. The reflective member 132 may be provided as a prism or a mirror having a reflective surface. The incident light may be reflected from the reflective surface of the reflective member 132 toward the lens module 140. For example, the folded module 130 may change a propagation path of light incident in the first axis direction (X-axis direction) to the optical axis direction (Z-axis direction).

The lens module 140 may include a plurality of lenses and a lens barrel 142 on which the plurality of lenses are mounted. In FIG. 3, only a lens (hereinafter referred to as a first lens) L1 disposed closest to the subject, among the plurality of lenses, is illustrated. However, this is only an example, and one or more lenses may be arranged between the first lens L1 and the image sensor module 200 in the optical axis direction (Z-axis direction).

The plurality of lenses may form a plurality of lens groups to perform a zoom operation, and the plurality of lens groups may be provided to be movable in the optical axis direction (Z-axis direction). Referring to FIG. 1, an optical axis direction (Z-axis direction) of a camera module 100, in accordance with one or more embodiments, may be perpendicular to a thickness direction of the portable electronic device 1. Therefore, even when the number of lenses and a total track length (TTL) of the camera module 100 increase, a thickness of the camera module 100 may not increase. Therefore, the portable electronic device 1 may also be manufactured to have a relatively reduced thickness.

In an example embodiment, a thickness of a camera module 100 may be determined by a height of the image sensor module 200, e.g., a length in the first axis direction (X-axis direction).

The one or more examples provide an image sensor module 200 of which a size is reduced in the first axis direction (X-axis direction) to reduce a thickness of a portable electronic device 1, and a method of manufacturing the same.

First, with further reference to FIGS. 4 to 7, an image sensor module 200, in accordance with one or more embodiments, will be described.

Figure 4:
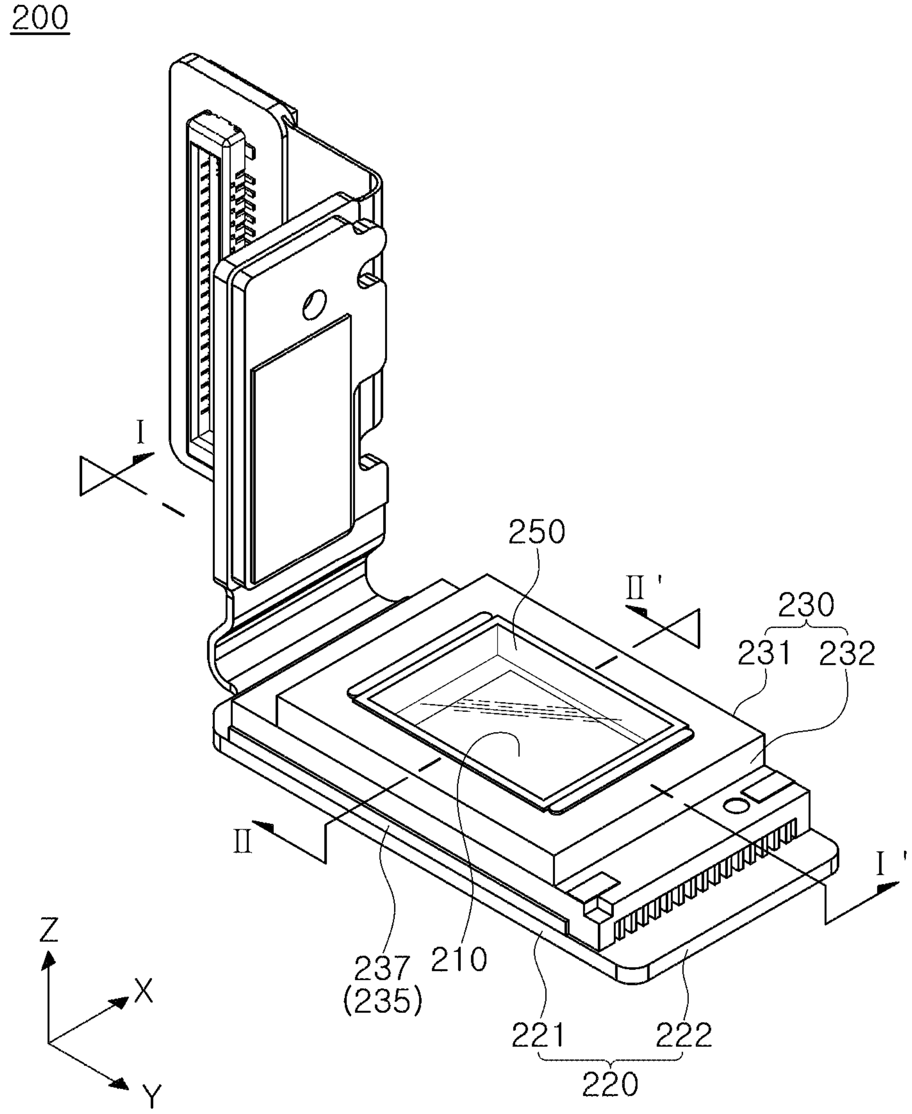
FIG. 4 illustrates a perspective view of an example image sensor module, in accordance with one or more embodiments.
Figure 5:
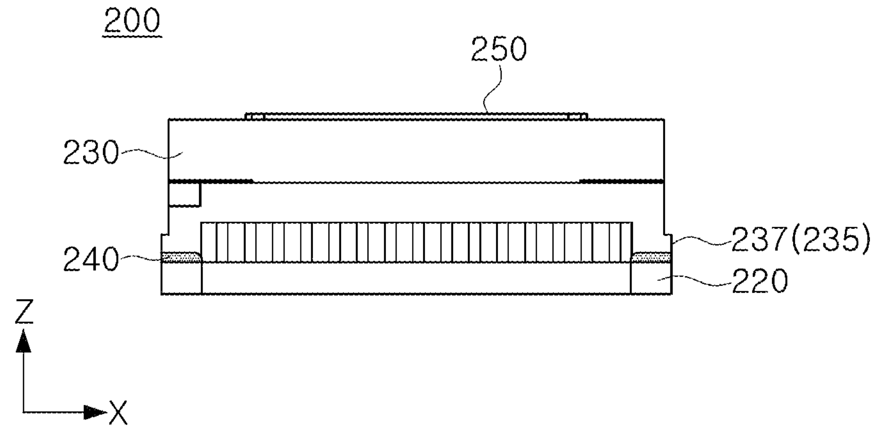
FIG. 5 illustrates a side view of the example image sensor module of FIG. 4.
Figure 6:
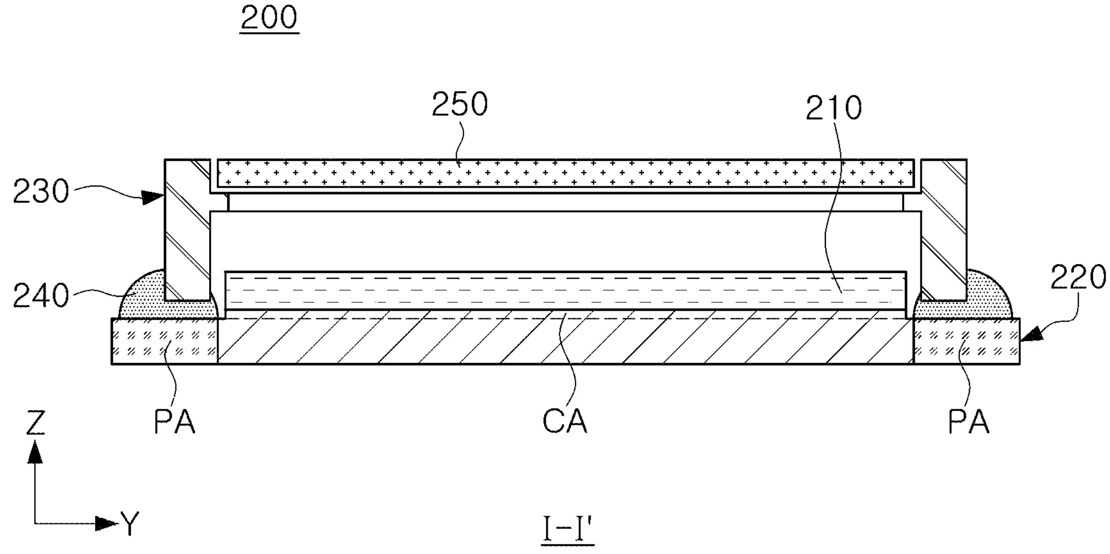
FIG. 6 illustrates a cross-sectional view of the example image sensor module of FIG. 4, taken along line I-I'.
Figure 7:
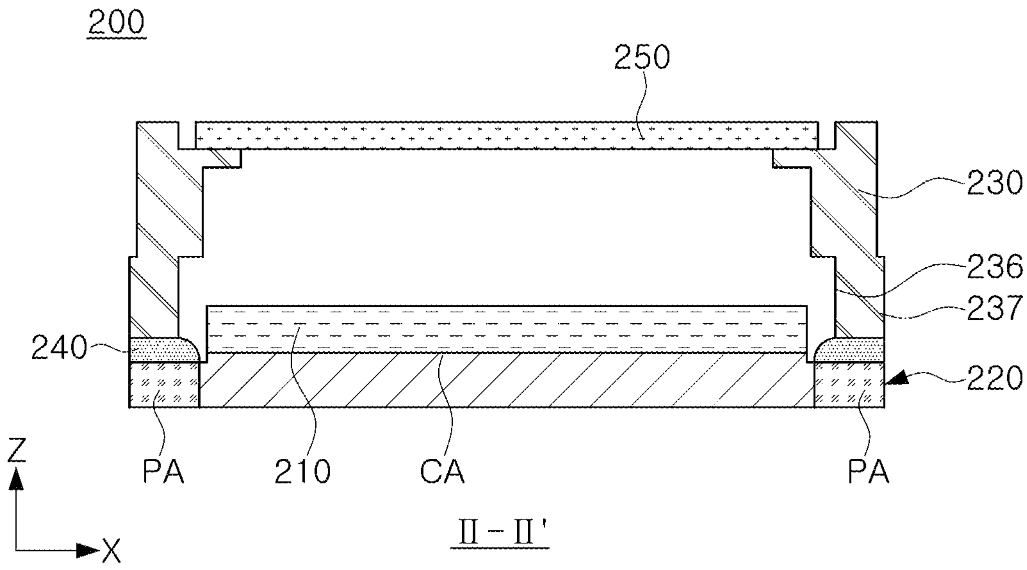
FIG. 7 illustrates a cross-sectional view of the image sensor module of FIG. 4, taken along line II-II'.

FIG. 4 illustrates a perspective view of an image sensor module, in accordance with one or more embodiments, FIG. 5 illustrates a side view of the image sensor module of FIG. 4, FIG. 6 illustrates a cross-sectional view of the image sensor module of FIG. 4, taken along line I-I', and FIG. 7 illustrates a cross-sectional view of the image sensor module of FIG. 4, taken along line II-II'.

An image sensor module 200, in accordance with one or more embodiments, may be disposed behind a lens module 140 in the optical axis direction (Z-axis direction). Light passing through the lens module 140 may be incident on the image sensor module 200, and the image sensor module 200 may convert incident light into an electrical signal.

The image sensor module 200 may include an image sensor 210, a substrate 220 on which the image sensor 210 is mounted, and a sub-housing 230 that is coupled to a housing 120, as described above.

The image sensor 210 may be mounted on the substrate 220 such that an imaging plane of the image sensor 210 faces the lens module 140. Therefore, incident light incident on a camera module 100 may pass through the folded module 130 and the lens module 140 in sequence, and may finally reach the imaging plane of the image sensor 210. The image sensor 210 may convert an image formed on the imaging plane into an electrical signal.

Referring to FIG. 4, in an example, the substrate 220 may be a rigid or flexible printed circuit board (PCB). Various components, in addition to the image sensor 210, may be mounted on a substrate portion formed of a rigid material, and a substrate portion formed of a flexible material may be provided to be bendable. Hereinafter, the substrate 220 will be described, focusing on the substrate portion formed of a rigid material.

The image sensor 210 may be mounted on the substrate 220. The image sensor 210 may be mounted on the substrate 220 such that a center of the image sensor 210 approximately (or substantially) coincides with a center of the substrate 220. In an example, the image sensor 210 may be mounted approximately in a central portion CA of the substrate 220.

Pads for electrical connection and signal transmission between components may be disposed in a region (hereinafter referred to as a peripheral portion PA) surrounding the central portion CA. Additionally, the sub-housing 230 may be disposed in the peripheral portion PA. Specifically, the substrate 220 may be coupled to the sub-housing 230 through an adhesive 240 in the peripheral portion PA. When the substrate 220 and the sub-housing 230 are coupled, the image sensor 210 may be contaminated by a portion of the adhesive 240 overflowing around an adhesion region. Therefore, the central portion CA of the substrate 220 on which the image sensor 210 is mounted may be provided to protrude more in the optical axis direction (Z-axis direction), as compared to the peripheral portion PA.

The substrate 220 may have a rectangular shape including a pair of long side portions 221 and a pair of short side portions 222. A length of the substrate 220 may correspond to a distance between the pair of short side portions 222, and a width of the substrate 200 may correspond to a distance between the pair of long side portions 221. Furthermore, the distance between the pair of long side portions 221 may correspond to a thickness of a camera module 100 according to an embodiment of the present disclosure, and may be approximately (or substantially) equal to a width of the sub-housing 230.

Since the sub-housing 230 may be coupled to the substrate 220 in the peripheral portion PA of the substrate 220, the central portion CA on which the image sensor 210 is mounted in a state in which the sub-housing 230 is coupled to the substrate 220 may be accommodated in the sub-housing 230.

The sub-housing 230 may have a shape that may be open in the optical axis direction (Z-axis direction) such that light passing through the lens module 140 may be received by the image sensor 210. An infrared (IR) cut filter 250 may be disposed on the sub-housing 230 to be spaced apart from the image sensor 210 in the optical axis direction (Z-axis direction). Therefore, light passing through the lens module 140 may be received by the image sensor 210 after filtering out the light in an infrared region through the infrared cut-off filter 250.

The sub-housing 230 may be coupled to the substrate 220 via the adhesive (e.g., epoxy) 240. The sub-housing 230 may have a rectangular cross-section including a pair of long side portions 231 and a pair of short side portions 232, like the substrate 220, and the adhesive 240 may be at least disposed between four sides of the sub-housing 230 and the substrate 220.

A length of the sub-housing 230 may correspond to a distance between the pair of short side portions 232, and may be shorter than the length of the substrate 220. Therefore, a portion of the substrate 220 in a length direction of the substrate 220 and the sub-housing 230 may be exposed more than an external side surface of the sub-housing 230, and as illustrated in FIG. 6, a portion of the adhesive 240 overflowing around an adhesion region may be disposed on the exposed portion of the substrate 220.

A width of the sub-housing 230 may correspond to a distance between the pair of long side portions 231, and may be approximately (or substantially) equal to the width of the substrate 220.

When the width of the sub-housing 230 is manufactured from the beginning to be approximately (or substantially) equal to the width of the substrate 220, and the sub-housing 230 is coupled to the substrate 220, there may be a problem that it is difficult to treat a portion around an adhesion region, especially, a portion of the adhesive 240 overflowing external side surfaces of the sub-housing 230 and the substrate 220.

Therefore, an image sensor module 200, in accordance with one or more embodiments, may be manufactured by a trimming operation of matching the width of the substrate 220 and the width of the sub-housing 230. Additionally, the size of the image sensor module 200 may be reduced during this process. A detailed explanation regarding this will be provided later.

The sub-housing 230 may include stepped portions 236 and 237 disposed on an internal side surface and an external side surface of the sub-housing 230, respectively. Referring to FIG. 7, the sub-housing 230 may include a first stepped portion 236 grooved in a direction in which an internal space of the sub-housing 230 is expanded, on the internal side surface facing the image sensor 210 in the width direction. A certain gap may be secured between the image sensor 210 and the sub-housing 230 based on the first stepped portion 236 without increasing a size of the substrate 220. Additionally, the external side surface of the sub-housing 230 may include a second stepped portion 237 that protrudes in an outward direction on a portion coupled to the substrate 220. The second stepped portion 237 provided on the external side surface of the sub-housing 230 may be a portion of a rib surface 235, which will be described later. For example, both the first stepped portion 236 and the second stepped portion 237 may contribute to miniaturization of the image sensor module 200. Therefore, the first stepped portion 236 and the second stepped portion 237 may be provided on at least the pair of long side portions 231, and may be selectively provided on the pair of short side portions 232.

Next, with further reference to FIGS. 8 and 9, a method of manufacturing an image sensor module 200, in accordance with one or more embodiments, will be described.

Figure 8:
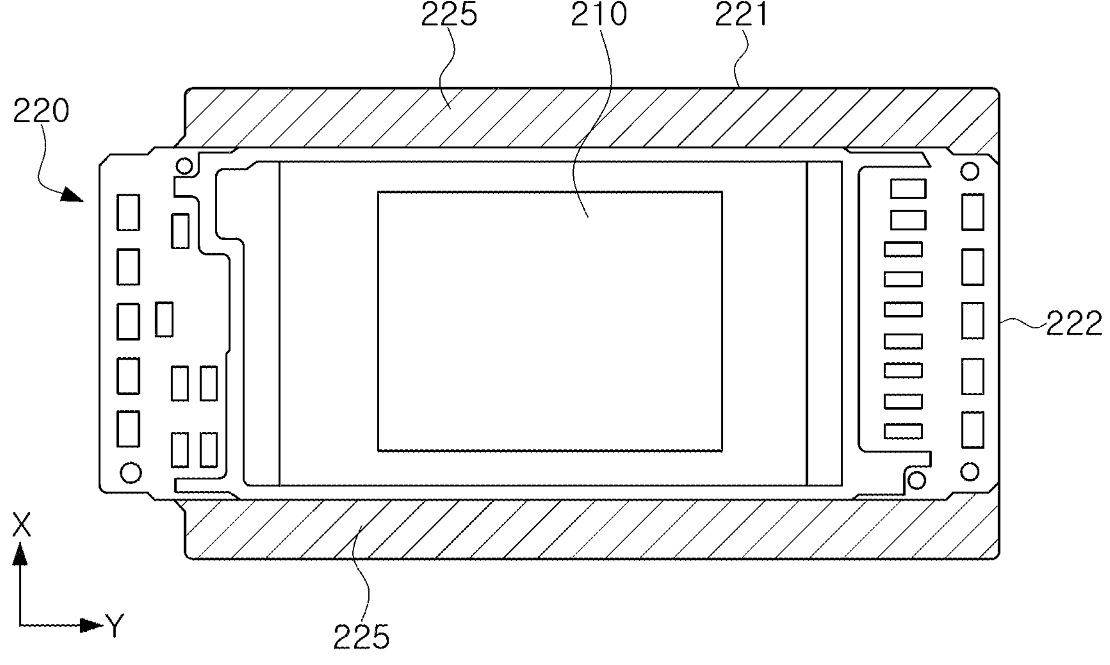
FIG. 8 illustrates a substrate, before a trimming operation, in accordance with one or more embodiments.
Figure 9:
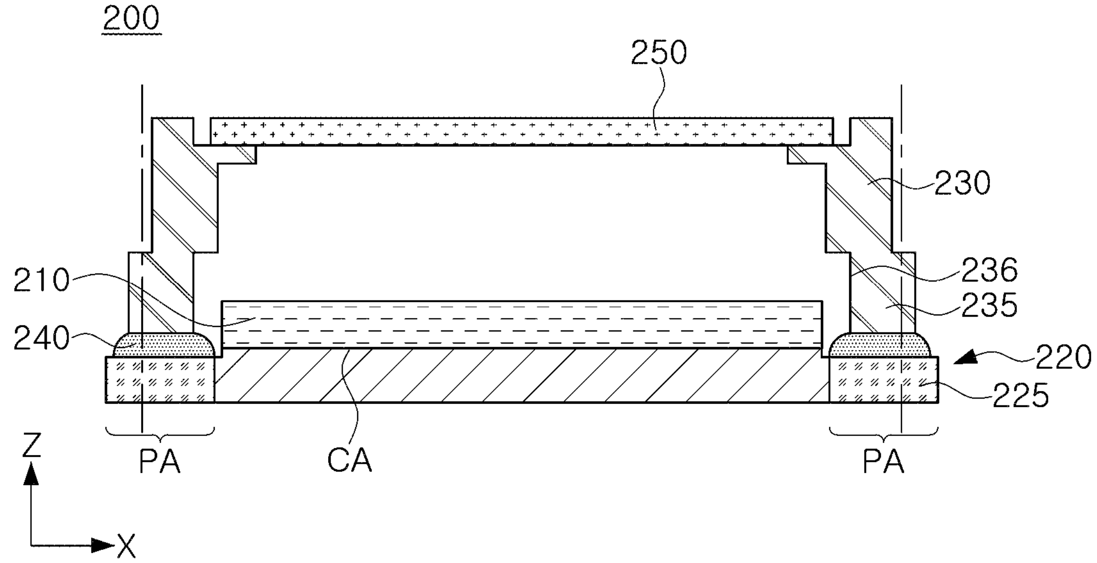
FIG. 9 illustrates a trimming, in accordance with one or more embodiments.

FIG. 8 illustrates a substrate, before a trimming operation, in accordance with one or more embodiments, and FIG. 9 illustrates a trimming operation, in accordance with one or more embodiments.

A method of manufacturing an image sensor module 200, in accordance with one or more embodiments, may include preparing a substrate 220, assembling an image sensor 210, assembling a sub-housing 230, and a processing operation (hereinafter, a trimming operation).

The substrate 220 prepared for manufacturing (assembling) of the image sensor module 200 may have a larger area than an area of the substrate 220 of the image sensor module 200, in accordance with one or more embodiments, illustrated in FIG. 4 or the like. Referring to FIG. 8, the substrate 220 may include a dummy portion 225 that expands an area of the substrate 220 in a width direction. Therefore, the dummy portion 225 may be a portion of a peripheral portion PA. Most of the dummy portion 225 may be removed in a trimming operation to be described later.

The image sensor 210 may be assembled on the substrate 220 including the dummy portion 225. The image sensor 210 may be seated in a central portion CA, and may be electrically connected to the substrate 220 through a pad exposed to the peripheral portion PA in a length direction of the substrate 220. The image sensor 210 may be electrically connected to the substrate 220 through a bonding wire. It is also possible to change some structures and adopt other electrical connection methods.

The sub-housing 230 (including an infrared cut filter 250) may be assembled on the substrate 220 on which the image sensor 210 is mounted. The sub-housing 230 may be coupled to the peripheral portion PA via an adhesive 240 to accommodate the image sensor 210.

The sub-housing 230 may include a rib surface 235 on at least one pair of opposing sides, among four sides, coupled to the substrate 220. According to an embodiment, at least one pair of long side portions 231 may include a rib surface 235 that extends the sub-housing 230 in a width direction. Since a width direction of the sub-housing 230 may correspond to a width direction of the substrate 220, at least a portion of the rib surface 235 extending in the width direction of the sub-housing 230 from the pair of long side portions 231 may be coupled to the dummy portion 225 extending in the width direction of the substrate 220 through the adhesive 240. Since the sub-housing 230 includes the rib surface 235 in a portion to be coupled to the substrate 220, an area to which the adhesive 240 is applied, e.g., an adhesion area, may increase, such that a coupling force between the sub-housing 230 and the substrate 220 may be improved. Although not separately illustrated in the drawings, the pair of short side portions 232 may also include a rib surface that extends the sub-housing 230 in a length direction. In this example, an effect of improving the coupling force may increase. Additionally, the dummy portion 225 may be provided with a free space **225*a* on an external side surface of the rib surface 235, and the free space 225*a* may receive a portion of the adhesive 240 overflowing an external side surface of a joint portion when the sub-housing 230** is coupled.

An image sensor module 200, in accordance with one or more embodiments, may undergo a trimming operation to reduce a size of the image sensor module 200 after assembling the sub-housing 230.

Referring to FIG. 9, the trimming operation may be an operation of removing the dummy portion 225 from the substrate 220 and the rib surface 235 from the sub-housing 230. In an embodiment, at least a portion of the dummy portion 225 and at least a portion of the rib surface 235 may be cut by a laser. Preferably, most of the dummy portion 225 and most of the rib surface 235 may be cut in the trimming operation, and a portion of the dummy portion 225 and a portion of the rib surface 235 may remain an image sensor module 200 according to an embodiment of the present disclosure. The dummy portion 225 and the rib surface 235 may be entirely cut, but considering assembly tolerance of the sub-housing 230, it is preferable to leave a portion of the dummy portion 225 and a portion of the rib surface 235 in the image sensor module 200. Through the trimming operation, external sides of the pair of long side portions 221 of the substrate 220 and external sides of the pair of long side portions 231 of the sub-housing 230 may be arranged on the same plane, and an external side of the adhesive 240 therebetween may also be disposed on the same plane as the above. Furthermore, preferably, a width of the substrate 220 may be approximately (or substantially) equal to a width of the sub-housing 230.

A size of an image sensor module 200, in accordance with one or more embodiments, may be reduced in a height direction that determines a thickness of a camera module 100, as at least a portion of the dummy portion 225 and at least a portion of the rib surface 235 are removed in the trimming operation. According to an example embodiment, the dummy portion 225 and the rib surface 235 may be removed in the trimming operation after providing a sufficient adhesion area in the assembly operation, to achieve durability and miniaturization of the camera module 100 and the image sensor module 200 at the same time.

In accordance with one or more embodiments described above, an image sensor module 200 may be reduced in size in a direction that determines a thickness of a camera module 100, and accordingly, the thickness of the camera module 100 may decrease.

In accordance with one or more embodiments, a size of an image sensor module may be reduced in a direction that determines a thickness of a camera module, and the thickness of the camera module may be thus reduced.

While specific examples have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An image sensor module, comprising:

an image sensor comprising an imaging plane;

a substrate on which the image sensor is mounted; and a sub-housing, coupled to the substrate, and configured to accommodate the image sensor, wherein, first end portions of the sub-housing and the substrate and second end portions of the sub-housing and the substrate, are spaced apart in a first direction parallel to the imaging plane, and are disposed together on one plane, perpendicular to the first direction, and wherein the sub-housing comprises a first stepped portion that is grooved in a direction away from the image sensor, on an internal side surface of the sub-housing that faces the image sensor.

2. The image sensor module of claim 1, wherein the sub-housing and the substrate comprise a pair of long side portions and a pair of short side portions, and wherein the first direction is a direction in which the pair of long side portions face each other.

3. The image sensor module of claim 1, wherein the sub-housing further comprises a second stepped portion that protrudes in an outward direction on the first end portion of the sub-housing and the second end portion of the sub-housing that are spaced apart in the first direction, and wherein the first end portions of the sub-housing and the substrate and the second end portions of the sub-housing and the substrate that are spaced apart in the first direction are disposed on the one plane, perpendicular to the first direction, together with the second stepped portion.

4. The image sensor module of claim 1, wherein the sub-housing is coupled to the substrate by an adhesive, and wherein both end portions of the adhesive, spaced apart in the first direction, are disposed on one plane, intersecting and perpendicular to the first direction, together with the sub-housing and the substrate.

5. The image sensor module of claim 1, wherein the substrate comprises:

a central portion on which the image sensor is mounted; and a peripheral portion provided to surround the central portion and to which the sub-housing is coupled, wherein the central portion is configured to protrude more than the peripheral portion.

6. The image sensor module of claim 2, wherein the pair of short side portions face each other in a second direction, wherein the substrate comprises a portion that is exposed more than an external side surface of the sub-housing in the second direction.

7. The image sensor module of claim 6, wherein both end portions of the adhesive, spaced apart from each other in the second direction, are disposed on the portion of the substrate that is exposed more than the external side surface of the sub-housing.

8. An image sensor module, comprising:

an image sensor which has an imaging plane;

a substrate on which the image sensor is mounted; and a sub-housing, coupled to the substrate, and configured to accommodate the image sensor, wherein a width of the sub-housing is equal to a width of the substrate in a first direction, parallel to the imaging plane, and wherein the sub-housing comprises a first stepped portion that is grooved in a direction, away from the image sensor, on an internal side surface facing the image sensor in the first direction.

9. The image sensor module of claim 8, wherein the sub-housing further comprises a second stepped portion that protrudes in an outward direction on a first end portion of the sub-housing and a second end portion of the sub-housing that are spaced apart in the first direction, wherein the width of the substrate is equal to a width of the sub-housing including the second stepped portion in the first direction.

10. A camera module, comprising:

a folded module comprising a reflective member;

a lens module comprising a plurality of lenses;

a housing which accommodates at least the lens module among the folded module and the lens module; and the image sensor module of claim 1 coupled to one side of the housing and configured to receive light passing through the lens module.

11. The camera module of claim 10, wherein the sub-housing further comprises a second stepped portion that protrudes in an outward direction on a first end portion of the sub-housing and a second end portion of the sub-housing that are spaced apart in the first direction.

12. The camera module of claim 10, wherein the sub-housing is coupled to the substrate by an adhesive, wherein both end portions of the adhesive, spaced apart in the first direction, are disposed on one plane, perpendicular to the first direction, together with the sub-housing and the substrate.

13. The camera module of claim 10, wherein the sub-housing and the substrate comprise a pair of long side portions that face each other in the first direction and a pair of short side portions that face each other in the second direction, and wherein the first direction corresponds to a height direction of the image sensor module.

14. A portable electronic device, comprising the camera module of claim 10.

15. A method of manufacturing an image sensor module, the method comprising:

preparing a substrate including a dummy portion disposed on a first side of the substrate and a second side of the substrate spaced apart in a first direction;

assembling an image sensor onto the substrate;

assembling a sub-housing comprising a rib surface on the first side of the substrate and the second side of the substrate that are spaced apart in the first direction, onto the substrate on which the image sensor is assembled; and performing a trimming operation of cutting at least a portion of the rib surface and at least a portion of the dummy portion, wherein the sub-housing includes a first stepped portion that is grooved in a direction, away from the image sensor, on an internal side surface of the sub-housing that faces the image sensor in the first direction.

16. The method of claim 15, wherein the sub-housing is assembled onto the substrate through an adhesive, wherein, in the trimming operation, a portion of the adhesive disposed on an external side the rib surface and between the rib surface and the dummy portion is removed.

17. The method of claim 15, wherein the sub-housing and the substrate comprise a pair of long side portions that face each other in the first direction and a pair of short side portions that face each other in a second direction, and wherein the trimming operation is performed in a third direction, perpendicular to the first direction and the second direction.

18. The method of claim 17, wherein the trimming operation is implemented by a laser.

19. The method of claim 15, wherein the image sensor is assembled onto a central portion of the substrate, and the sub-housing is assembled onto a peripheral portion of the substrate that is disposed to surround the central portion of the substrate, and wherein the dummy portion forms a portion of the peripheral portion of the substrate.

* * * * *